United States Patent [19]

Truher et al.

[11] Patent Number: 5,425,860

[45] Date of Patent: * Jun. 20, 1995

[54] PULSED ENERGY SYNTHESIS AND DOPING OF SILICON CARBIDE

[75] Inventors: Joel B. Truher, San Rafael; James L. Kaschmitter, Pleasanton; Jesse B. Thompson, Brentwood, all of Calif.; Thomas W. Sigmon, Beaverton, Oreg.

[73] Assignee: The Regents of the University of California, Oakland, Calif.

[*] Notice: The portion of the term of this patent subsequent to Nov. 1, 2011 has been disclaimed.

[21] Appl. No.: 43,820

[22] Filed: Apr. 7, 1993

[51] Int. Cl.$^6$ ............................................. C23C 14/34
[52] U.S. Cl. ........................... 204/192.23; 204/192.15; 204/192.16; 204/192.17; 204/192.25; 204/192.26
[58] Field of Search ............... 204/192.23, 192.16, 204/192.15, 192.26; 501/88; 423/345

[56] References Cited

U.S. PATENT DOCUMENTS

| | | | |
|---|---|---|---|
| 4,426,405 | 1/1984 | Hierholzer et al. | 427/50 |
| 4,446,169 | 5/1984 | Castle et al. | 427/53.1 |
| 4,476,150 | 10/1984 | Rose | 427/10 |
| 4,496,450 | 1/1985 | Hitotsuyanagi et al. | 204/192.23 |
| 4,534,997 | 8/1985 | Brotz | 427/53.1 |
| 4,673,587 | 6/1987 | Kamigaito et al. | 204/192.15 |
| 4,923,716 | 5/1990 | Brown et al. | 423/345 |
| 4,925,830 | 5/1990 | Walsh | 505/1 |
| 5,047,131 | 9/1991 | Wolfe et al. | 204/192.23 |
| 5,075,130 | 12/1991 | Reeber et al. | 204/192.16 |
| 5,106,687 | 4/1992 | Tanino et al. | 428/141 |
| 5,151,966 | 9/1992 | Brehm et al. | 385/128 |

OTHER PUBLICATIONS

T. Sugii et al. IEEE Elec. Dev. Lett., vol. 9, No. 2, Feb. 1988, pp. 87–89.

Nishino, Hazuki, Matsunami, Tanaka "Chemical Vapor Deposition of Single Crystalline β-SiC Films of Si Substrate with Sputtered SiC Intermediate Layer", Journal of Electrochem. Society, Dec. 1990.

*Primary Examiner*—R. Bruce Breneman
*Assistant Examiner*—Rodney G. McDonald
*Attorney, Agent, or Firm*—L. E. Carnahan; Henry P. Sartorio

[57] ABSTRACT

A method for producing beta silicon carbide thin films by co-depositing thin films of amorphous silicon and carbon onto a substrate, whereafter the films are irradiated by exposure to a pulsed energy source (e.g. excimer laser) to cause formation of the beta-SiC compound. Doped beta-SiC may be produced by introducing dopant gases during irradiation. Single layers up to a thickness of 0.5–1 micron have been produced, with thicker layers being produced by multiple processing steps. Since the electron transport properties of beta silicon carbide over a wide temperature range of 27°–730° C. is better than these properties of alpha silicon carbide, they have wide application, such as in high temperature semiconductors, including hetero-junction bipolar transistors and power devices, as well as in high bandgap solar arrays, ultra-hard coatings, light emitting diodes, sensors, etc.

22 Claims, No Drawings

PULSED ENERGY SYNTHESIS AND DOPING OF SILICON CARBIDE

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the fabrication of silicon carbide films, particularly to pulsed energy synthesis and doping of beta silicon carbide, and more particular to a method for fabricating and doping beta silicon carbide thin films using pulsed laser processing.

Silicon carbide is an attractive material for numerous applications, and its high bandgap, high thermal conductivity, and high electron saturation velocity make it attractive for high power electronic device applications. Also, its hardness and transparency make it attractive for than film optical coatings. Silicon carbide (SIC) can exist in 170 polytypes, most of which are hexagonal or rhombohedral $\alpha$-SiC, and $\alpha$-SiC and coatings thereof have been produced by various techniques and for various applications. The prior techniques for preparing ceramic coatings including $\alpha$-SiC coated substrates, which include the use of laser energy are exemplified by U.S. Pat. Nos. 4,426,405 issued Jan. 17, 1984 to F. J. Hierholzer, Jr. et al.; 4,446,169 issued May 1, 1984 to P. M. Castle et al.; 4,476,150 issued Oct. 9, 1984 to D. N. Rose; 4,534,997 issued Aug. 13, 1985 to G. R. Brotz; 4,925,830 issued May 15, 1990 to F. Walsh; and 5,151,966 issued Sep. 29, 1992 to C. Brehm et al.

While SiC can exist in numerous polytypes, only one type of cubic polytype, or cubic SiC has been identified, and denoted as 3C-or $\beta$-SiC. Thin films of beta silicon carbide ($\beta$-SiC) are of great interest since the electron transport properties are much better than $\alpha$-SiC over a wide temperature range of 27°–730° C. Epitaxial films of $\beta$-SiC have been primarily grown by chemical vapor deposition, with significant doping problems. Chemical vapor deposition of high purity $\beta$-SiC on the surface of a substrate is exemplified by U.S. Pat. No. 5,106,687 issued Apr. 21, 1992 to K. Tanino et al. By way of example, heterojunction bipolar transistor (HBT) devices have been fabricated using epitaxial $\beta$-SiC emitters on Si substrates, and high DC HFE gain of 800 was observed with undetectable recombination current, see T. Sugii et al., IEEE Elec. Dev. Lett 9(2) 87 (1988). HBT devices have also been fabricated using polycrystalline $\alpha$-SiC, but the current gain was limited by interface recombination which may have resulted from the low deposition temperature (600°–900° C.) required to prevent dopant redistribution in the silicon.

Deposition methods for silicon carbide include electron-beam-heated evaporation, plasma-enhanced chemical vapor deposition, vacuum sublimation, rapid thermal chemical vapor deposition, and chemical vapor deposition, including the use of off-axis substrates. The crystallinity resulting from these techniques is best near or above 1000° C., and the heterointerface quality appears to decrease below this temperature as well. The high temperatures required in these conventional processes can destroy the underlying device structures.

It has been determined by the present inventors that laser processing of thin films of amorphous silicon and carbon co-deposited on various substrates produces $\beta$-SiC, with very small crystallites, tens of angstroms in size, but no other phases (Si, C, or SiC) were found. Also, it has been determined that doped $\beta$-SiC may be produced by introducing dopant gases during the laser processing. Thus, the present invention fills a need for a reliable, controllable, low cost method for producing thin films of $\beta$-SiC and for doping it, at low substrate temperatures.

SUMMARY OF THE INVENTION

It is an object of this invention to provide thin films of beta silicon carbide.

A further object of the invention is to provide for pulsed energy synthesis and doping of silicon carbide.

A further object of the invention is to provide for pulsed laser doping of silicon carbide.

A further object of the invention is to provide for laser synthesis of beta silicon carbide thin films.

Another object of the invention is to provide a method for producing beta silicon carbide from sputtered amorphous silicon carbide thin films.

Another object of the invention is to provide a method using pulsed laser processing to produce polycrystalline beta silicon carbide from sputtered amorphous silicon carbide films on a substrate, while maintaining low substrate temperatures.

Another object of the invention is to provide a method for producing beta silicon carbide from sputtered amorphous silicon carbide thin films.

Another object of the invention is to provide a method using pulsed laser processing to produce polycrystalline beta silicon carbide from sputtered amorphous silicon carbide films on a substrate, while maintaining low substrate temperatures.

Another object of the invention is to provide a method for fabricating beta silicon carbide thin films by using an XeCl excimer laser to selectively crystallize areas in $\alpha$-SiC films which were sputtered at room temperature onto a substrate, such as fused-quartz ($SiO_2$).

Other objects and advantages will become apparent from the following description which serves to explain the principles of the invention. Basically, the invention involves selective synthesis of polycrystalline beta silicon carbide from sputtered amorphous silicon carbide thin films using pulsed laser processing. More specifically, the invention involves a method for producing and doping beta silicon carbide thin films, by co-depositing amorphous silicon and carbon on a substrate and then irradiating the thus formed films with a pulsed energy source (e.g. excimer laser), with the doping being produced by introducing dopant gases during irradiation of the films. Use of the pulsed energy source (pulsed laser processing) provides a reliable, controllable, low cost method for producing thin films of beta silicon carbide and for doping it, while maintaining low substrate temperatures. Alloying and doping at a low temperature can be critical since the high temperatures required in previously known processes can destroy the underlying device structures or substrate.

DETAILED DESCRIPTION OF THE INVENTION

The present invention is directed to a method for producing thin films of doped or undoped beta silicon carbide ($\beta$-SIC), using pulsed energy processing. Thin films of $\beta$-SiC have wide applications, including high temperature semiconductors, heterojunction bipolar transistors (HBT), power devices, high bandgap solar array window layers, ultra-hard coatings, light emitting diodes, sensors, etc. This is due to its high bandgap, high thermal conductivity, high electron saturation velocity, and electron transport properties over a wide temperature range of 27°–730° C. Pulsed energy processing enables the production of polycrystalline β-SiC while maintaining very low substrate temperatures, and is reliable, controllable, low cost, and enables doping during processing by merely introducing the dopant gases into the process chamber. The β-SiC can also be laser doped after crystallization to produce shallow doped junctions. In addition, pulsed energy processing can be used to anneal conventionally implanted dopants. Alloying and doping at low substrate temperatures can be critical since the high temperatures required in conventional processes can destroy the underlying device structures and substrates.

In carrying out the invention, thin films of amorphous silicon and carbon are co-deposited on substrates, such as silicon, fused silica, quartz, or plastics. The thus co-deposited thin films are then irradiated by exposure to a pulsed energy source, such as an excimer laser, to cause formation of the β-SiC phase. Proper control of energy source parameters, including pulse duration, intensity, and frequency, are crucial to obtaining β-SiC. Single layers of the material up to a thickness of about 0.5–1 micron can be produced. Thicker layers may be produced by multiple processing steps. Purity of materials and accurate control of amounts of material deposited are not critical to obtaining desired results.

Doped β-SiC can also be produced by introducing dopant gases into the processing chamber during laser irradiation of the thin layers, allowing for in-situ formation of shallow junctions with controlled dopant concentrations. Also, the dopant gases can be introduced after crystallization using laser irradiation. In addition, laser irradiation can be used to anneal conventionally implanted dopants.

The advantage of the type of processing of this invention is that it allows for formation of high quality material using low cost, low temperature processing which is compatible with a variety of substrates and underlying materials, while producing high dopant concentrations, activation levels, and shallow junctions.

The method of this invention has been verified in the production of β-SiC by performing Transmission Electron Microscopy (TEM) and Small Area Diffraction (SAD) on a number of samples. SAD analysis indicates an appropriate number of rings (diffraction patterns), namely 5, and with appropriate spacing, verified by correlation to National Bureau of Standards tables. Appropriate spacings for the diffraction rings are: 2.52(111), 2.18(200, 1.54(220), 1.31(311), and 1.26(222).

EXAMPLE I

Silicon and carbon were simultaneously sputtered at room temperature onto clean $SiO_2$ (fused silica) substrates to a thickness of 750 angstroms using argon in a DC magnetron sputtering deposition apparatus. The stoichiometry and uniformity of these coatings were measured using Rutherford back-scattering (RBS) from 2.2 MeV He ions, and they were observed to be quite non-stoichiometric and also contaminated with a large amount of oxygen, forming approximately Si⌀.34C⌀.45O⌀.21. These samples were placed in an evacuated chamber and exposed to 30 nanosecond (full-width at half-maximum) pulses of 308 nm XeCl eximer laser radiation. Several different samples were made, using differing numbers of pulses and pulse energy densities. The temperature of the substrate (fused silica) during laser processing never exceeded 180° C. However, with other substrates the temperature can be higher. RBS was again used to measure the stoichiometry of the processed regions. Oxygen was observed to be expelled from the surface region, but the stoichiometry was largely unchanged. Simultaneously, small-area electron diffractograms (SADs) were made using the TEM beam. The SAD picture of as-deposited material was a disc, indicating amorphous material structure. The processed samples, however, resulted in SADs with a ring structure indicating a fine-grain polycrystalline structure. The spacing of these rings was correlated to the calibrations for the SAD/TEM apparatus, traceable to the National Bureau of Standards (NBS). The &spacings were measured and these values in angstroms were compared to the above-listed standard expected for β-SiC. The material produced contained very small crystallites, tens of angstroms (less than 50 Å) in size, but no other phases (Si, C, or SiC) were found.

The experiments conducted to verify the invention have established the use of pulsed laser processing (PLP) to produce polycrystalline beta silicon carbide (3C polytype) from sputtered amorphous silicon carbide thin films at very low substrate temperature. The β-SiC thin films thus produced are suitable for HBT emitters, for example, and due to the melting induced by the PLP, a high-quality interface is provided between the emitter and base.

Doped β-SiC films were produced during laser irradiation of the α-SiC films by introducing gaseous boron trifluoride ($BF_3$) or phosphorous pentafluoride ($PF_5$) into the processing chamber, at 50 Torr for example, whereby in-situ formation of shallow junctions were produced. Other dopants, such as arsenic pentafluoride ($AsF5$) and gallium trifluoride ($GaF_3$) may be used in this process.

In addition to silicon and fused silica, the substrates may be made of SiC or low temperature plastics, which include ethylene-chloro-trifluoroethylene (E-CTFE), ethylene-tetra-fluoroethylene (E-TFE), polyethersulfone (PES), polyvinylidene fluoride (PVDF), and poly-tetra-fluoro-ethylene (PTFE).

Irradiation by laser energy has been found effective to anneal conventionally implanted dopants. This annealing technique was carried out by implantation of Ga ions into the SiC crystal, then pulsing the surface with a 308 nm XeCl laser. Melting of the implanted region with subsequent epitaxial regrowth of the SiC (Ga) layer from the underlying substrate was found. Results were verified using RBS and SIMS techniques.

It has thus been shown that the present invention provides a method for producing, and doping, beta silicon carbide thin films suitable for high power applications, and which is reliable, controllable, and low cost while maintaining low substrate temperatures. The method, utilizing a pulsed laser, provides for formation of high quality material using low cost, low temperature processing which is compatible with a variety of substrates and underlying materials.

While a particular laser and materials, parameters, energies, etc., have been set forth to provide an understanding of the invention, such is not intended to limit the invention. Modifications and changes will become apparent to those skilled in the art, and it is intended that the invention be limited only by the scope of the appended claims.

We claim:

1. A method for producing beta silicon carbide thin films, comprising the steps of:
   co-depositing amorphous silicon and carbon on a substrate to form a thin film thereon; and
   irradiating the thus formed film with a pulsed energy source causing formation of beta silicon carbide.

2. The method of claim 1, wherein the step of co-depositing the silicon and carbon is carried out using a sputtering technique.

3. The method of claim 1, wherein the step of irradiating the film is carried out using an excimer laser.

4. The method of claim 1, wherein the step of irradiating the film is carried out using pulses of 308 nm XeCl excimer laser radiation.

5. The method of claim 4, wherein the pulses from the laser are 30 nanosecond (full-width at half-maximum) pulses.

6. The method of claim 1, additionally including the step of forming the substrate from the group consisting of silicon, fused silica, SiC, and plastics selected from the group of E-CTFE, E-TFE, PES, PVDF, and PTFE.

7. The method of claim 1, wherein the film is formed to a thickness not greater than about 1 micron.

8. The method of claim 7, additionally including the step of co-depositing multiple layers of amorphous silicon and carbon on the substrate.

9. The method of claim 1, additionally including the step of introducing at least one dopant gas during the step of irradiating the film for producing doped beta silicon carbide.

10. The method of claim 9, wherein the step of introducing the dopant gas is carried out by selecting at least one dopant gas from the group consisting of $BF_3$, $PF_5$, $AsF_5$, and $GaF_3$, and introducing the selected dopant into the processing chamber during irradiation.

11. The method of claim 1, wherein the silicon and carbon were co-deposited at room temperature.

12. The method of claim 11, wherein the step of co-depositing the silicon and carbon was carried out using argon in a DC magnetron sputtering deposition apparatus.

13. A process for selective synthesis of polycrystalline beta silicon carbide (3C polytype) from sputtered amorphous silicon carbide thin films using excimer laser radiation, comprising the step of:
   simultaneously depositing by sputtering a film of amorphous silicon and carbon on a fused silica substrate; and
   directing pulses of 308 nm XeCl excimer laser radiation onto the thus formed film to selectively crystallize areas in the film, thereby producing beta silicon carbide.

14. The process of claim 13, wherein the step of depositing by sputtering was carried out at room temperature using argon in a DC magnetron sputtering deposition apparatus.

15. The process of claim 13, wherein the step of directing pulses of laser radiation onto the film was carried out using 30 nanosecond (full-width at half-maximum) pulses.

16. The process of claim 15, additionally including the step of introducing a dopant into the processing chamber during laser irradiation of the film, thereby producing doped beta silicon carbide.

17. The process of claim 16, wherein the dopant is composed of at least one gas selected from the group consisting of $BF_3$, $PF_5$, $AsF_5$ and $GaF_3$.

18. The process of claim 13, wherein the film of amorphous silicon and carbon was sputtered to a thickness of not greater than about one micron.

19. The method of claim 1, additionally including the steps of introducing at least one dopant gas after crystallization of the thus formed film by irradiation, and then irradiating with the pulsed energy source for producing doped beta silicon carbide.

20. The process of claim 16, wherein the step of introducing the dopant is carried out following crystallization by laser irradiation.

21. The method of claim 1, wherein the step of irradiating is carried out so that the temperature of the substrate does not exceed about 180° C. during irradiation of the thus formed film.

22. The process of claim 13, wherein the laser radiation is directed onto the thus formed film such that the temperature of the fused silica substrate does not exceed 180° C.

* * * * *